(12) United States Patent
Chen et al.

(10) Patent No.: US 10,692,701 B2
(45) Date of Patent: Jun. 23, 2020

(54) DRY ETCHING APPARATUS

(71) Applicant: TAIWAN SEMICONDUCTOR MANUFACTURING CO., LTD., Hsinchu (TW)

(72) Inventors: Chang-Yin Chen, Taipei (TW); Tung-Wen Cheng, Hsinchu (TW); Che-Cheng Chang, New Taipei (TW); Jr-Jung Lin, Hsinchu (TW); Chih-Han Lin, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 15/460,771

(22) Filed: Mar. 16, 2017

(65) Prior Publication Data
US 2017/0186588 A1 Jun. 29, 2017

Related U.S. Application Data

(62) Division of application No. 14/502,784, filed on Sep. 30, 2014, now Pat. No. 9,620,417.

(51) Int. Cl.
*H01L 21/8234* (2006.01)
*H01J 37/32* (2006.01)
(Continued)

(52) U.S. Cl.
CPC .. *H01J 37/32449* (2013.01); *H01L 21/32136* (2013.01); *H01L 21/32137* (2013.01);
(Continued)

(58) Field of Classification Search
None
See application file for complete search history.

(56) References Cited

U.S. PATENT DOCUMENTS

| 5,302,536 A | 4/1994 | Josquin |
|---|---|---|
| 9,318,343 B2 | 4/2016 | Ranjan et al. |

(Continued)

FOREIGN PATENT DOCUMENTS

| CN | 1787170 A | 6/2006 |
|---|---|---|
| CN | 103295904 A | 9/2013 |

(Continued)

OTHER PUBLICATIONS

Notice of Allowance U.S. Appl. No. 14/502,784 dated Nov. 28, 2016.

(Continued)

*Primary Examiner* — Charles D Garber
*Assistant Examiner* — Steven M Christopher
(74) *Attorney, Agent, or Firm* — McDermott Will & Emery LLP

(57) ABSTRACT

A dry etching apparatus includes a process chamber, a stage, a gas supply device and a plasma generating device. The stage is in the process chamber and is configured to support a wafer, wherein the wafer has a center region and a periphery region surrounding the center region. The gas supply device is configured to supply a first flow of an etching gas to the center region and supply a second flow of the etching gas to the periphery region. The plasma generating device is configured to generate plasma from the etching gas.

20 Claims, 16 Drawing Sheets

(51) Int. Cl.
*H01L 21/3213* (2006.01)
*H01L 29/66* (2006.01)
*H01L 29/78* (2006.01)
*H01L 21/67* (2006.01)

(52) U.S. Cl.
CPC .......... *H01L 21/67069* (2013.01); *H01L 21/823418* (2013.01); *H01L 21/823431* (2013.01); *H01L 21/823437* (2013.01); *H01L 21/823481* (2013.01); *H01L 29/66795* (2013.01); *H01L 29/785* (2013.01); *H01J 2237/334* (2013.01)

(56) References Cited

U.S. PATENT DOCUMENTS

| | | |
|---|---|---|
| 2002/0132437 A1 | 9/2002 | Tsou et al. |
| 2002/0142523 A1 | 10/2002 | Ryu et al. |
| 2002/0151183 A1* | 10/2002 | Yang .............. H01L 21/28114 438/714 |
| 2006/0124169 A1* | 6/2006 | Mizusawa ............ G05D 11/132 137/7 |
| 2009/0042321 A1* | 2/2009 | Sasaki ............... H01J 37/32449 438/10 |
| 2011/0049583 A1 | 3/2011 | Lin et al. |
| 2011/0244668 A1 | 10/2011 | Narihiro |
| 2012/0094495 A1 | 4/2012 | Honda et al. |
| 2012/0289054 A1* | 11/2012 | Holland ............ H01J 37/32082 438/711 |
| 2013/0228876 A1 | 9/2013 | Mor et al. |
| 2015/0187946 A1 | 7/2015 | Park et al. |
| 2015/0228755 A1 | 8/2015 | Wei et al. |
| 2016/0111531 A1 | 4/2016 | Dong |

FOREIGN PATENT DOCUMENTS

| | | |
|---|---|---|
| CN | 103946971 A | 7/2014 |
| JP | 11-17167 A | 1/1999 |
| JP | 2009-059806 A | 3/2009 |

OTHER PUBLICATIONS

Final Office Action U.S. Appl. No. 14/502,784 dated Jun. 2, 2016.
Non-Final Office Action U.S. Appl. No. 14/502,784 dated Dec. 15, 2015.

* cited by examiner

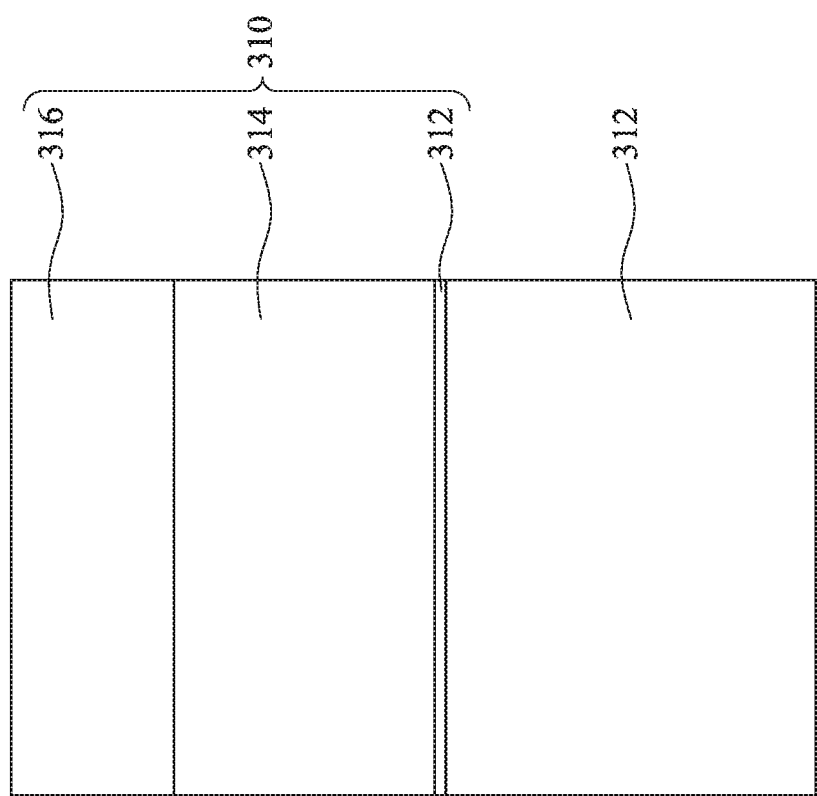

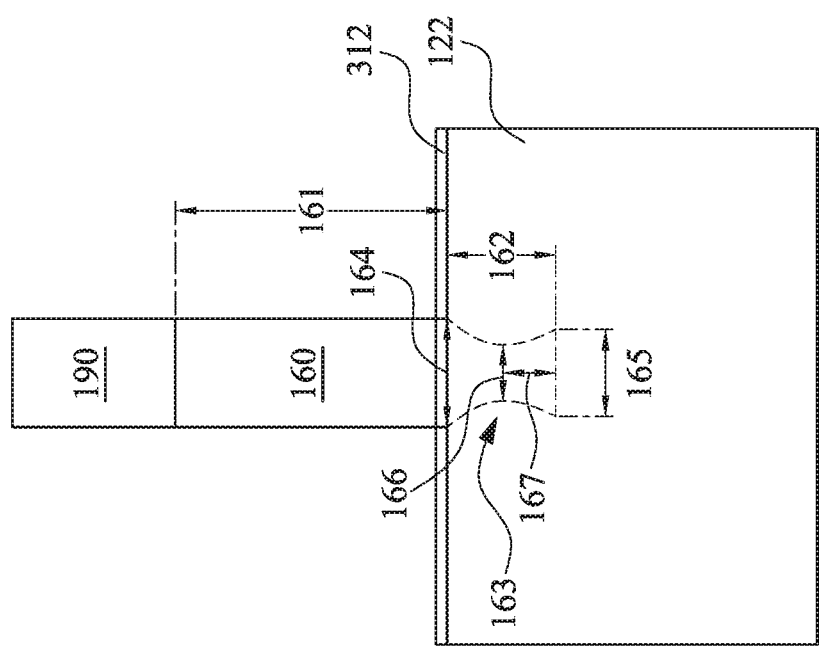

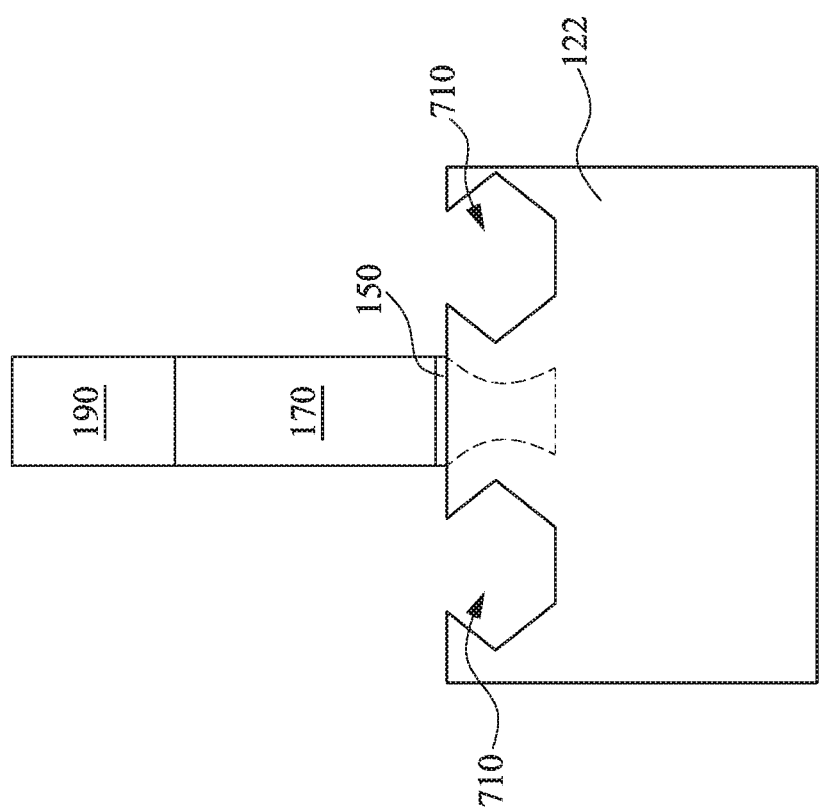

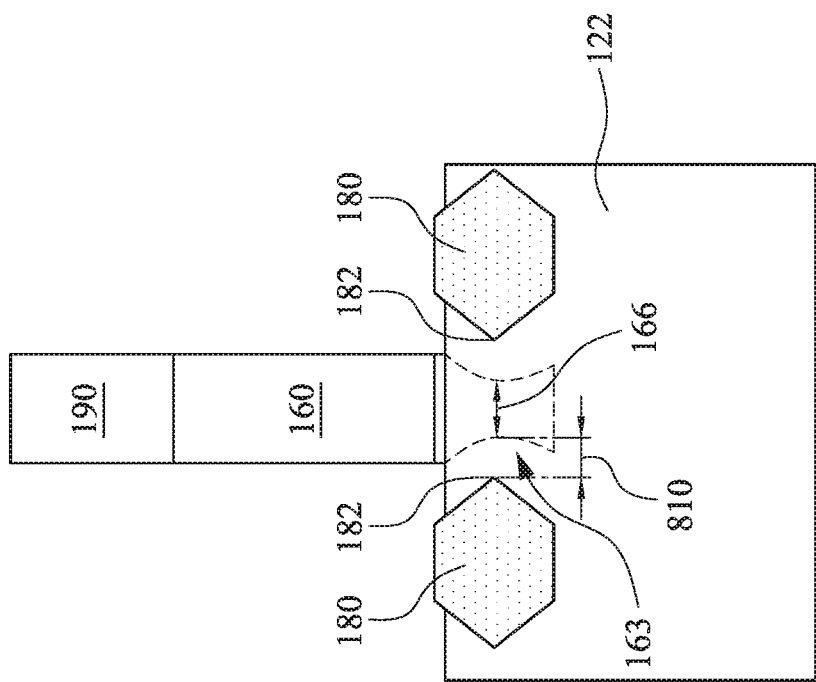

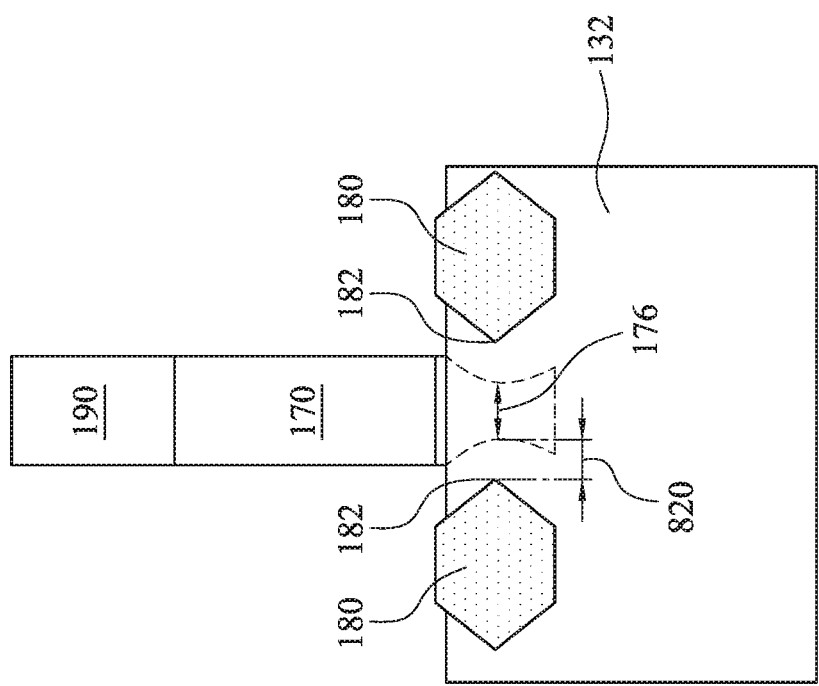

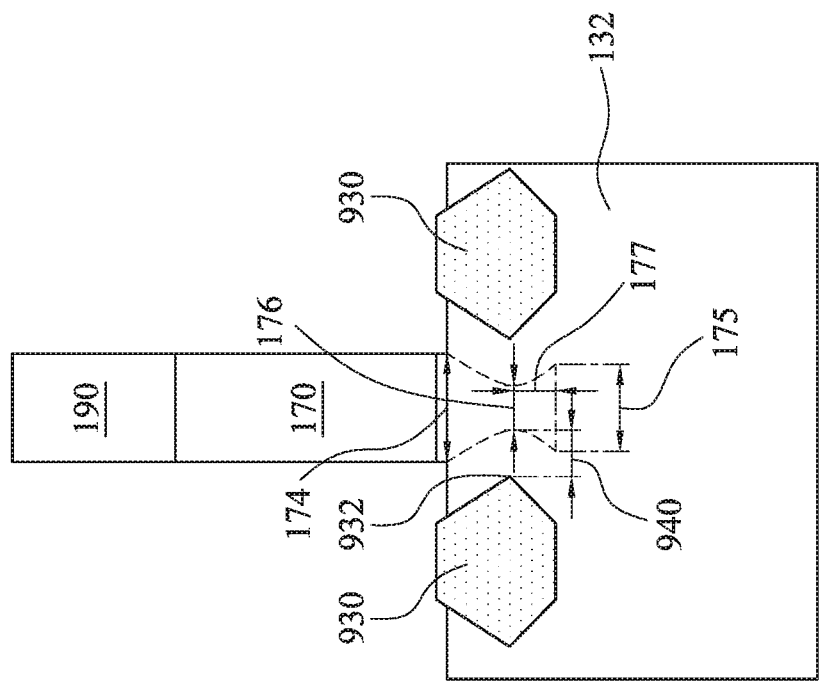
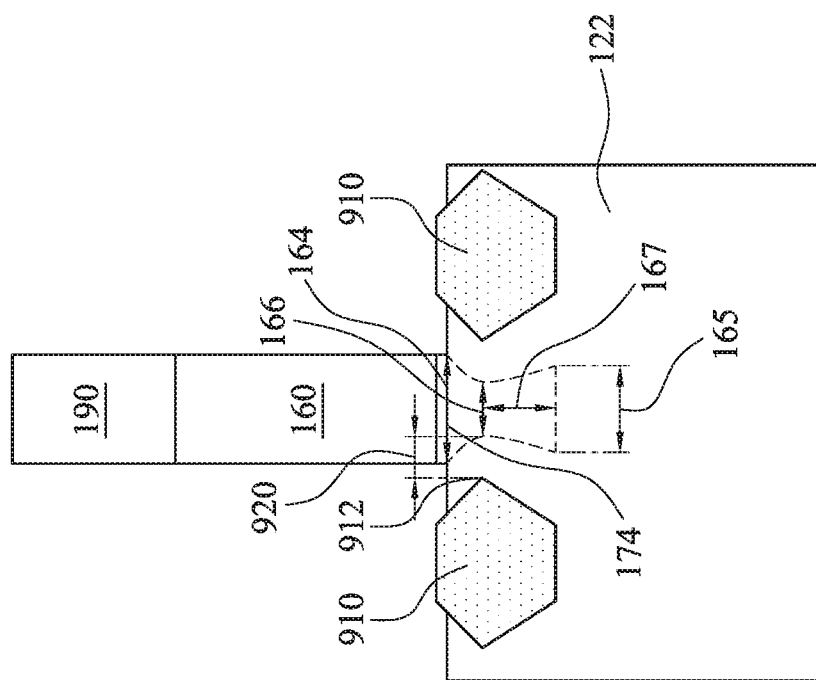
Fig. 9B
Fig. 9A

DRY ETCHING APPARATUS

CROSS-REFERENCE TO RELATED APPLICATION

The present application is a Divisional Application of the U.S. application Ser. No. 14/502,784, filed Sep. 30, 2014, which is herein incorporated by reference.

BACKGROUND

The semiconductor integrated circuit (IC) industry has experienced rapid growth. Over the course of the growth, functional density of the semiconductor devices has increased with the decrease of device feature size or geometry. The scaling down process generally provides benefits by increasing production efficiency, reducing costs, and/or improving device performance, but increases complexity of the IC manufacturing processes.

To address the increase of manufacturing complexity, similar advances in IC processing and manufacturing are necessary. For example, a three dimensional transistor, such as a fin-like field-effect transistor (Fin-FET), has been introduced to replace a planar transistor. In the manufacturing process of the Fin-FET devices, further improvements are constantly necessary to satisfy the performance requirement in the scaling down process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A to 8A are cross-sectional views of the Fin-FET device in FIG. 1 along the line AA at an intermediate stage of fabrication, in accordance with various embodiments.

FIG. 3B to 8B are cross-sectional views of the Fin-FET device in FIG. 1 along the line BB at an intermediate stage of fabrication, in accordance with various embodiments.

FIGS. 6C and 8C are cross-sectional views of the Fin-FET device in FIG. 1 along the line CC at an intermediate stage of fabrication, in accordance with various embodiments.

FIG. 9A is a cross-sectional view of the Fin-FET device in FIG. 1 along the line AA, in accordance with various embodiments.

FIG. 9B is a cross-sectional view of the Fin-FET device in FIG. 1 along the line CC, in accordance with various embodiments.

DETAILED DESCRIPTION

Figure 1:
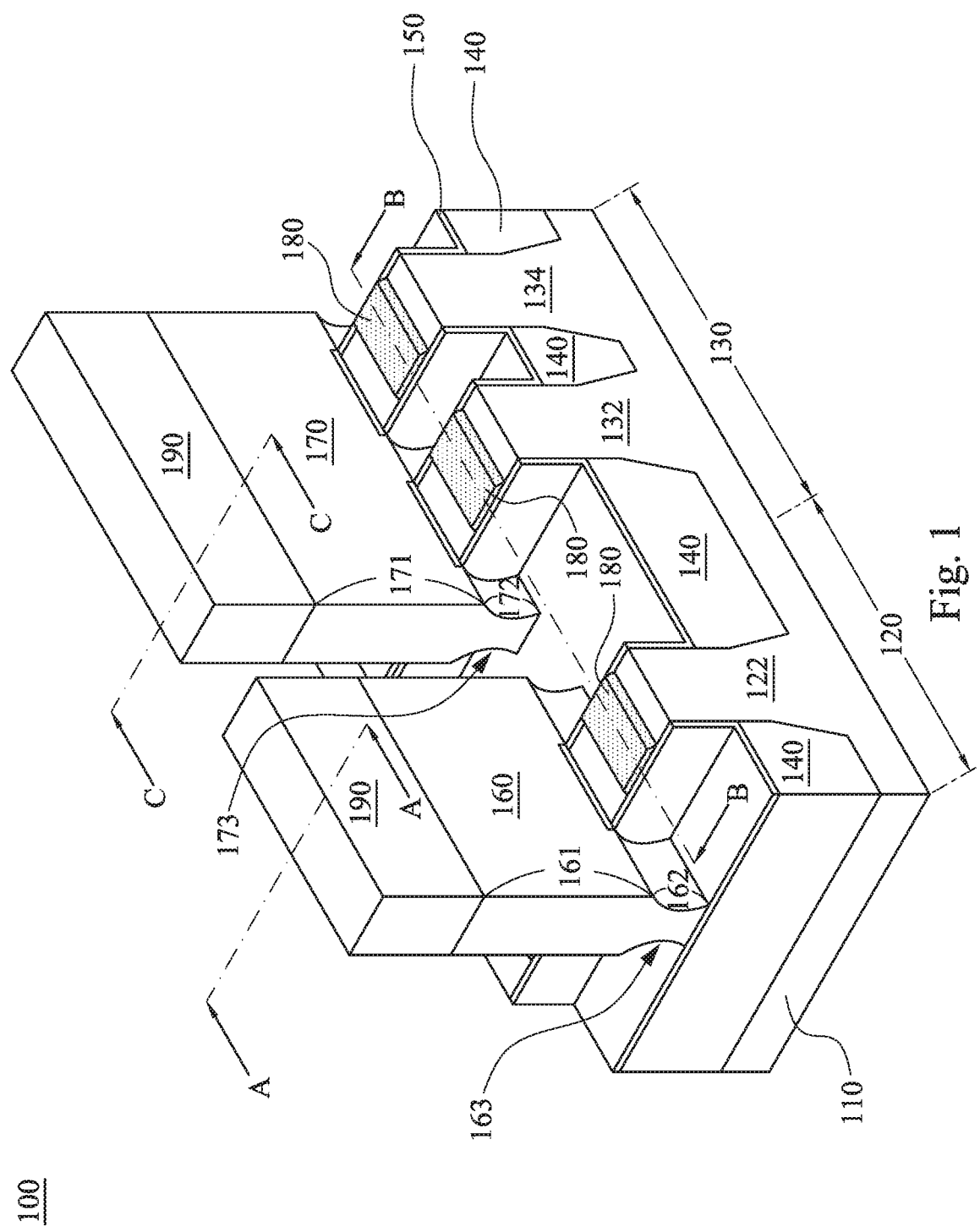
FIG. 1 is a schematic view of a Fin-FET device, in accordance with various embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A Fin-FET device has a fin in a semiconductor substrate and a gate located on top of the fin, which the semiconductor substrate, e.g., a wafer, includes a center region and a periphery region surrounding the center region. Generally, the gate formed at the center region includes a notched feature, but the gate formed at the periphery region will remain a footing feature. The footing feature will be perforated by an epitaxial structure fabricated in the fin easily, and the performance of the Fin-FET device is decreased significantly. Thus, it is necessary to provide a method to manufacture notched gates at the center region and at the periphery region.

Please referring to FIG. 1, FIG. 1 is a Fin-FET device in accordance to various embodiments of the present disclosure. A fin field-effect transistor (Fin-FET) device 100 includes a substrate 110, which includes a center region 120 and a periphery region 130. In embodiments, the substrate 110 is a wafer, and the periphery region 130 surrounds the center region 120. A plurality of fins 122, 132 and 134 are fabricated in the substrate 110, and isolation structures 140 separate the adjacent fins. The fin 122 is at the center region 120, and the fins 132 and 134 are at the periphery region 130. Besides, a gate oxide 150 covers the isolation structures 140 and sidewalls of the fins 122, 132 and 134.

A gate 160 at the center region 120 includes a first portion 161 on the fin 122 and a second portion 162 overlapped with the sidewalls of the fin 122, which the second portion 162 of the gate 160 includes a notched feature 163. Further, a gate 170 at the periphery region 130 includes a first portion 171 on the fins 132 and 134 and a second portion 172 overlapped with the sidewalls of the fins 132 and 134, which the second portion 172 of the gate 170 also includes a notched feature 173. Besides, the Fin-FET device includes a plurality of exitaxial structures 180 buried in the fins 122, 132 and 134.

In embodiments, the Fin-FET device also includes hard masks 190 disposed on the gate 160 and 170, respectively.

Figure 2:
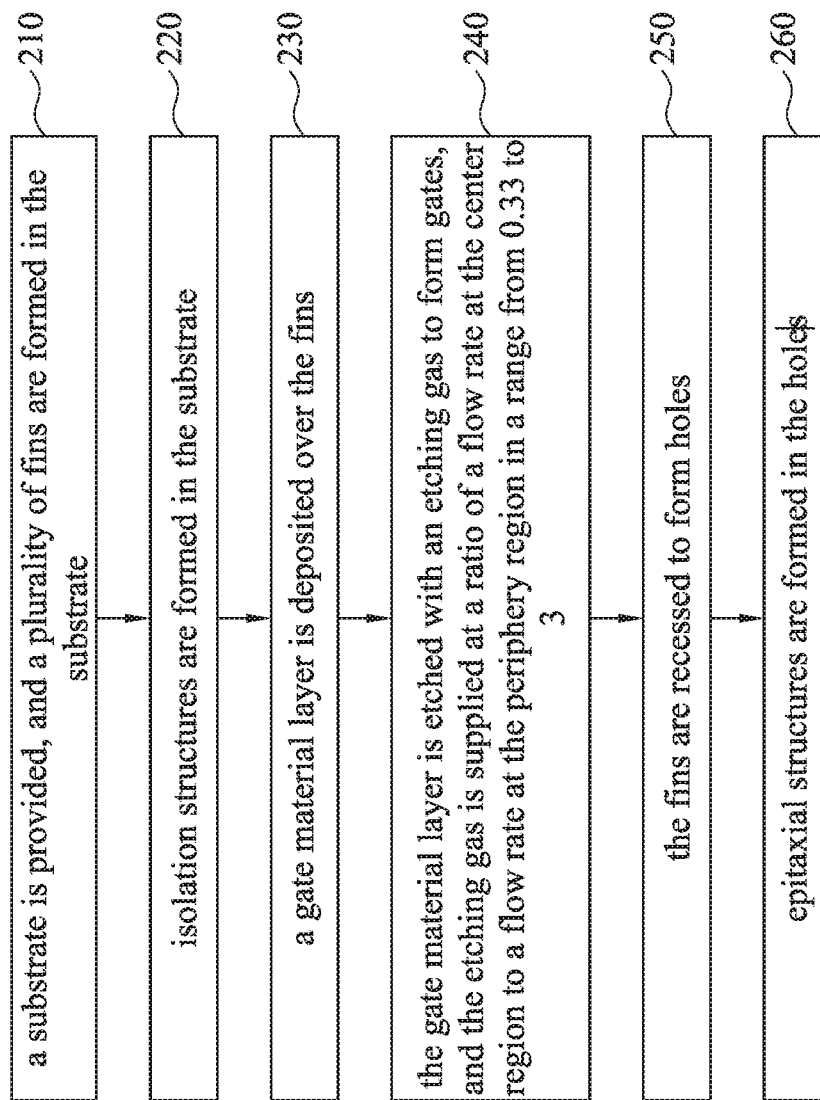
FIG. 2 is a flow chart of a method of manufacturing a Fin-FET device, in accordance with various embodiments.
Figure 3A:
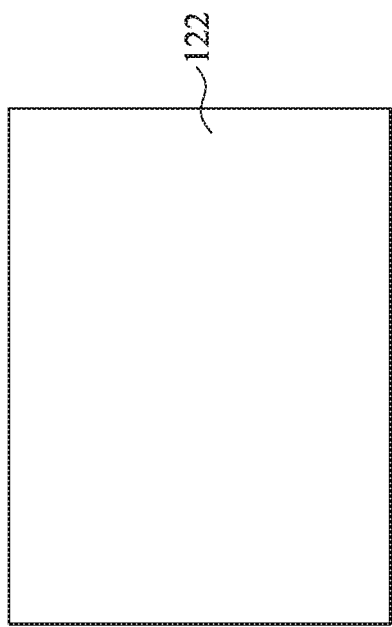
Figure 3B:
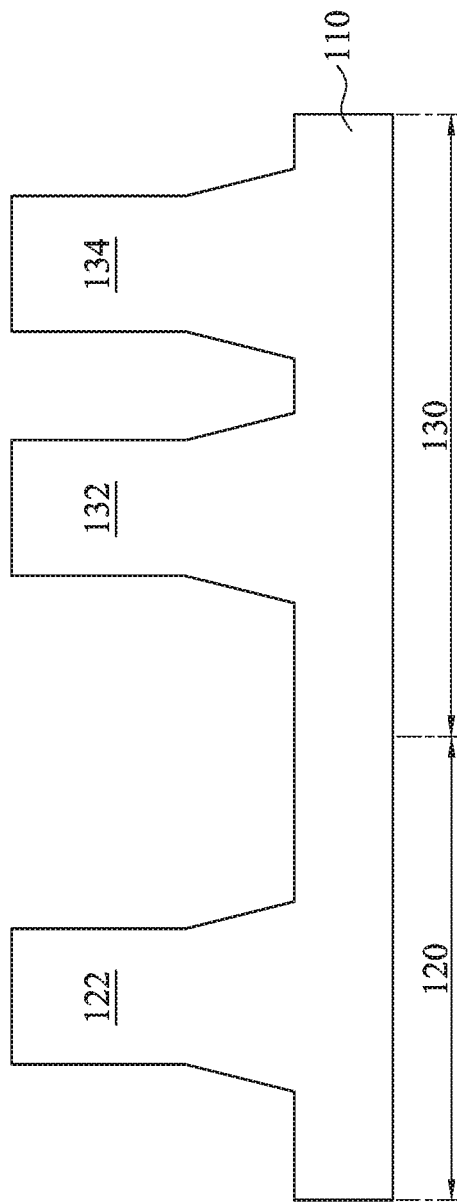

The present disclosure provides a method of manufacturing notched gates at the periphery region 130, and the gate 160 at the center region 122 still includes the notched feature 163. Please refer to FIG. 2, FIG. 3A to 8A and FIG. 3B to 8B at the same time. FIG. 2 is a flow chart of a method of manufacturing the Fin-FET device in accordance with various embodiments. FIG. 3A to 8A are cross-sectional views of the Fin-FET device in FIG. 1 along the line AA at an intermediate stage of fabrication. FIG. 3B to 8B are cross-sectional view of the Fin-FET device in FIG. 1 along the line BB at an intermediate stage of fabrication.

The method 200 begins with operation 210, a substrate 110 is provided, and a plurality of fins 122, 132 and 134 are formed in the substrate 110. Please refer to FIGS. 3A and 3B at the same time. The substrate 110 includes the center region 120 and the periphery region 130. In embodiments, the substrate 110 is a wafer, and the periphery region 130 surrounds the center region 120. The substrate 110 may be a bulk silicon substrate. Alternatively, the substrate 110 may include an elementary semiconductor including silicon or germanium in crystal, polycrystalline, and/or an amorphous structure; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; and/or combinations thereof.

In embodiments, the substrate 110 is a silicon-on-insulator (SOI) substrate. The SOI substrate is fabricated using separation by implantation of oxygen (SIMOX), wafer bonding, and/or other suitable methods, and an exemplary insulator layer may be a buried oxide layer (BOX).

The fin 122 is formed at the center region 122, and the fins 132 and 134 are formed at the periphery region 130. The fins 122, 132 and 134 may be fabricated using suitable processes including photolithography and etch processes. The photolithography process may include forming a photoresist layer (not shown) overlying the substrate 110, exposing the photoresist layer to form a pattern, performing post-exposure bake processes, and developing the pattern to form a masking element. The masking element mentioned above is used to protect portions of the substrate 110 while forming trenches in the substrate 110 by the etching process, leaving the extending fins 122, 132 and 134.

Numerous other embodiments of methods to form the fins 122, 132 and 134 in the substrate 110 may be suitable. In embodiments, source and drain regions may be formed at two opposite ends of the fins 122, 132 and 134 A channel region is between the source and drain regions, which the source and drain regions may be formed by any suitable method, such as growing by selective epitaxy.

Figure 4A:
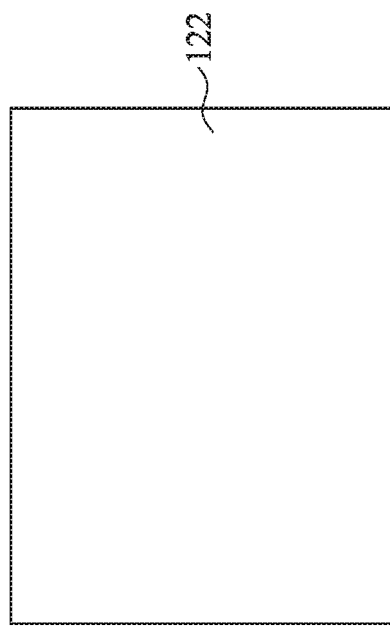
Figure 4B:
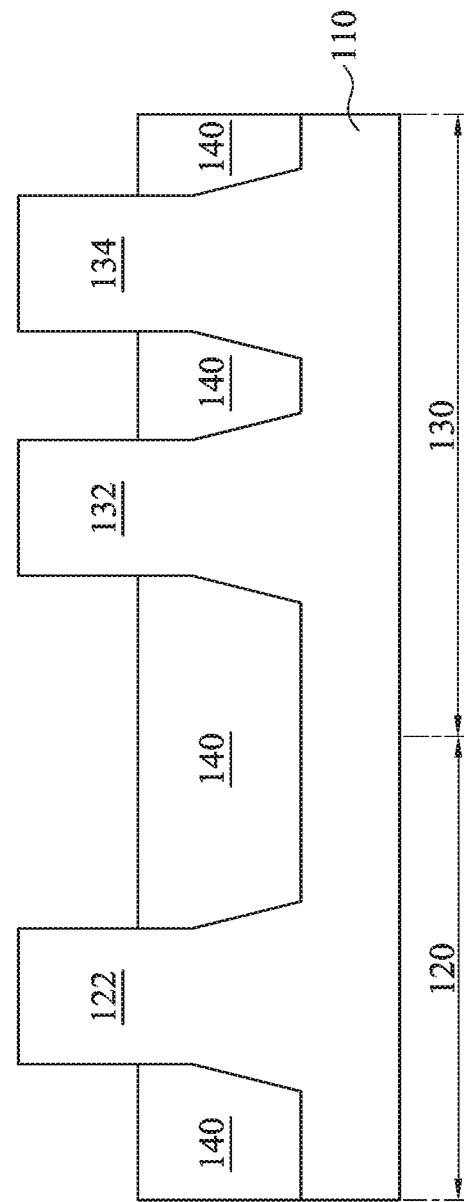

In operation 220, isolation structures 140 are formed in the substrate 110. As shown in FIGS. 4A and 4B, the isolation structures 140 separate adjacent fins in the substrate 110. For example, the trenches may be formed using reactive ion etch (RIE) and/or other suitable processes.

The isolation structures 140 may be a single layer or a multi-layer structure. The isolation structures 140 may be formed of silicon oxide, silicon nitride, silicon oxynitride, fluoride-doped silicate glass (FSG), a low-k dielectric material, and/or other suitable insulating materials. The isolation structures 140 may be a shallow trench isolation (STI) feature. In various embodiments, the isolation structures 140 are the STI feature and formed by etching trenches in the substrate 110, filling isolating material in the trenches, and performing a chemical mechanical polish (CMP) process. Other techniques for fabricating the isolation structures 140 are possible.

Figure 5B:
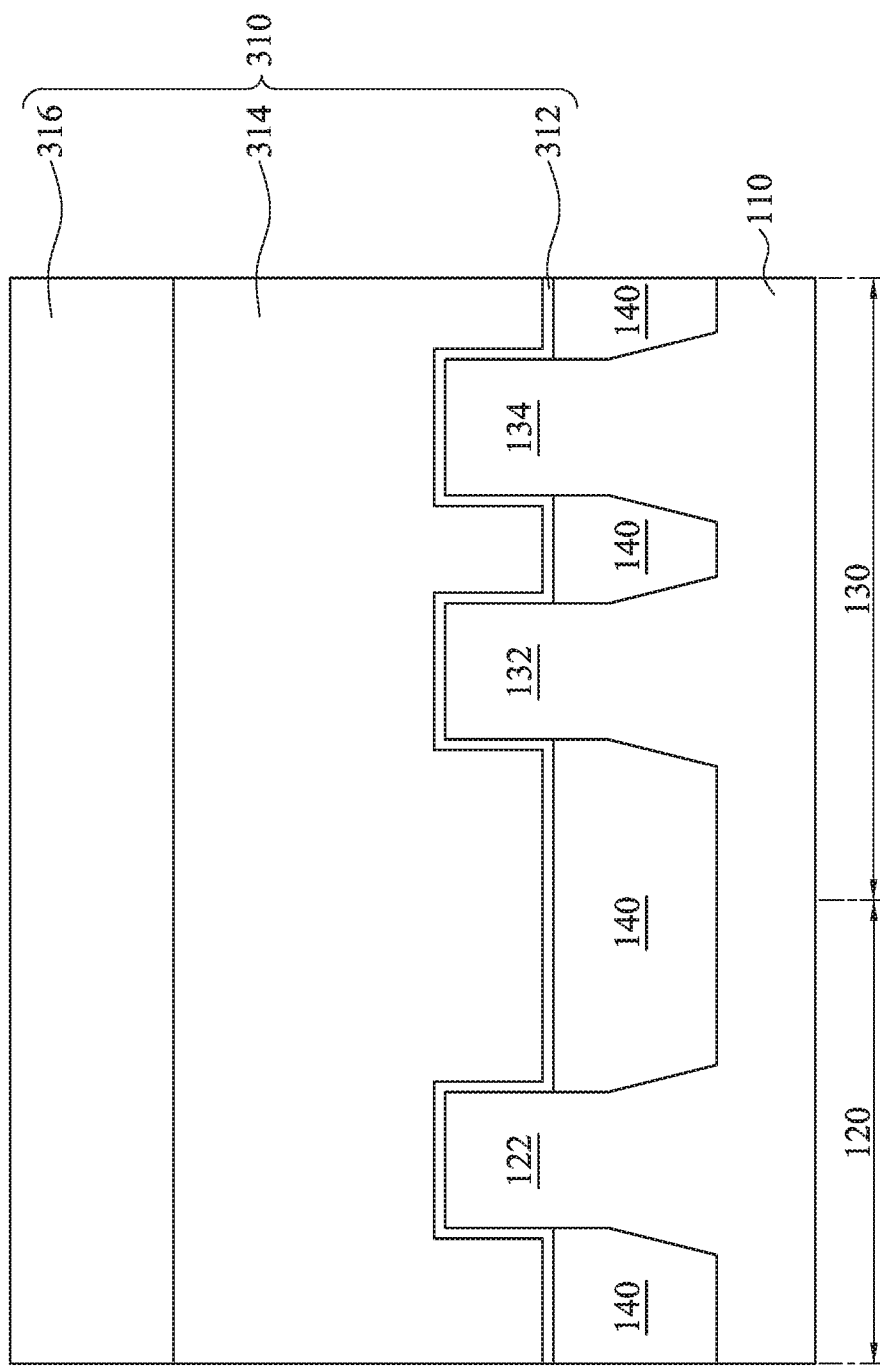

Referring to operation 230, a gate material layer 310 is deposited over the fins. In FIGS. 5A and 5B, the gate material layer 310 covers a top surface and sidewalls of the fins 122, 132 and 134. Besides, the gate material layer 310 also covers the isolation structures 140. The gate material layer 310 includes a gate oxide layer 312, a gate layer 314 and a hard mask layer 316. The gate oxide layer 312 is an etching stop layer, which could be fabricated by thermal oxidation, CVD or sputter. Other techniques for fabricating the gate oxide layer 312 are possible. In some embodiments, the gate oxide layer 312 may include a dielectric material including hafnium oxide, titanium nitride, silicon dioxide, silicon nitride, silicon oxynitride, or combination thereof.

The gate layer 314 is formed of polycrystalline-silicon (poly-Si), poly-crystalline silicon germanium (poly-SiGe), silicon nitride, or other suitable materials. The hard mask layer 316 is formed of silicon nitride, SiON, SiC, SiOC, spin-on glass (SOG), a low-k film, tetraethylorthosilicate (TEOS), plasma enhanced CVD oxide (PE-oxide), high-aspect-ratio-process (HARP) formed oxide, or combination thereof. After forming the gate material layer 310, a CMP process is performed to the gate material layer 310.

In various embodiments, the gate material layer 310 is the gate layer 314 including polycrystalline-silicon (poly-Si), poly-crystalline silicon germanium (poly-SiGe), silicon nitride, or other suitable materials.

Figure 6B:
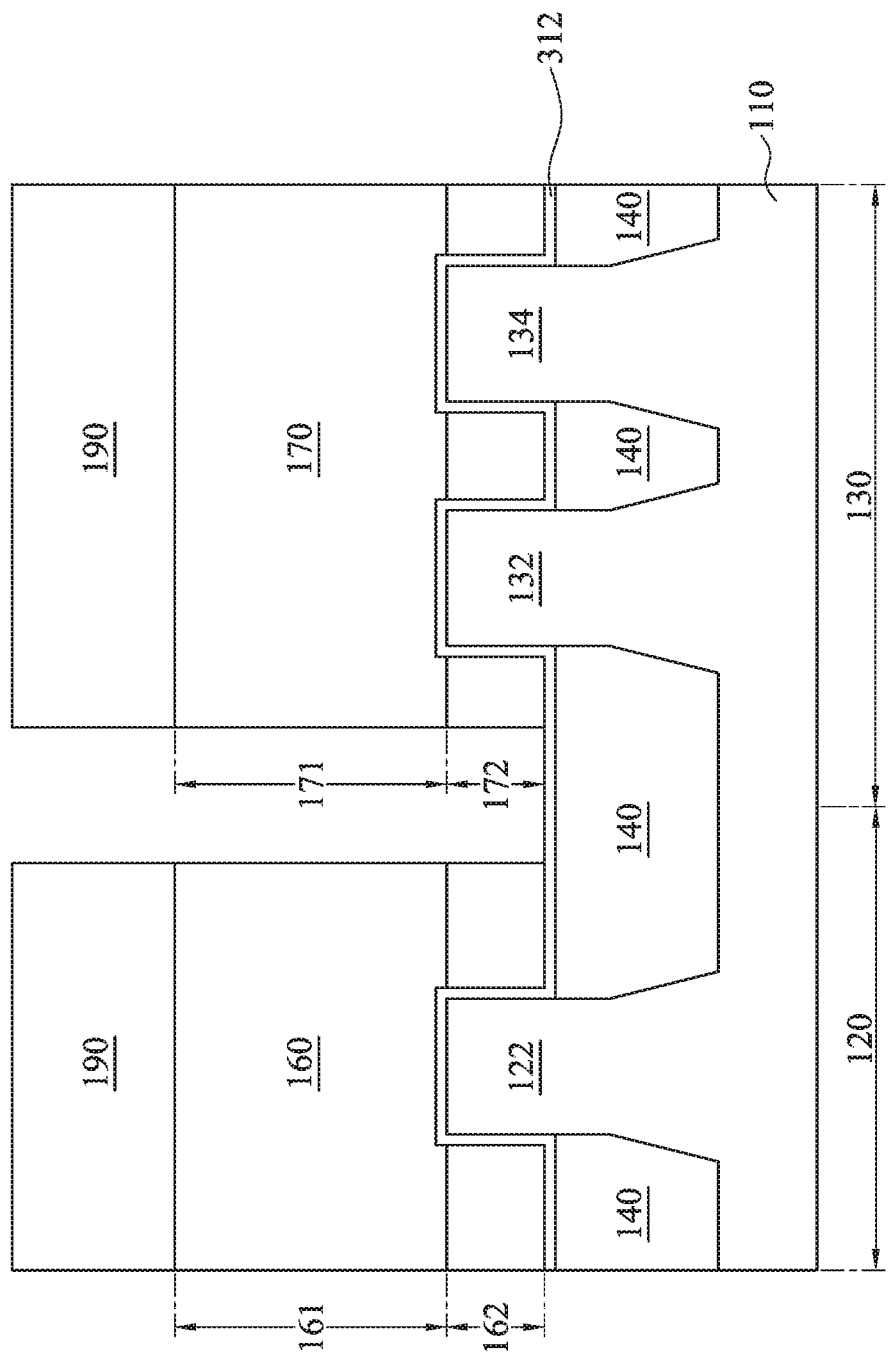

Continuing to operation 240, the gate material layer 310 is etched with an etching gas to form gates 160 and 170, and the etching gas is supplied at a ratio of a flow rate at the center region 120 to a flow rate at the periphery region 140 in a range from 0.33 to 3. As shown in FIGS. 6A and 6B, the gate oxide layer 312 is not etched, which protects the fins 122, 132 and 134. The gates 160 and 170 may be fabricated using suitable processes including photolithography and etch processes. The photolithography process may include forming a photoresist layer (not shown) overlying the gate material layer 310, exposing the photoresist layer to form a pattern, performing post-exposure bake processes, and developing the pattern to form a masking element. The masking element is used to protect portions of the gate material layer 310 by the etching process, leaving the gates 160 and 170. The etching process is a dry etching process referring to the use of plasma stripping, using the etching gas such as hydrogen bromide or oxygen.

In embodiments, the hard masks 190 are remained on the gates 160 and 170, respectively.

Since the CMP process could not form the even gate material layer 310, a thickness of the gate material layer 310 at the periphery region 130 is larger than a thickness of the gate material layer 310 at the center region 120. Thus, the gate 170 formed at the periphery region 130 usually includes a footing feature, which means some gate material will remain at the bottom of the gate 170. With fixing the total flow rate and increasing the flow rate of the etching gas at the periphery region 130, the gate material remained at the bottom of the gate 170 could be etched to form the notched feature 173. It should be noticed that the total flow rate is fixed, increasing the flow rate at the periphery region 130 also decreasing the flow rate at center region 120. But the gate 160 formed at the center region 120 still maintains the notched feature 163. More specifically, the ratio provided by the present disclosure will form the notched gate 170 at the periphery region 130 and the notched gate 160 at the center region 120 simultaneously.

Please refer to FIG. 6A to further clarify the present disclosure. The gate material layer 310 is etched to form the gate 160 at the center region 120. The gate 160 at the center region 120 includes the first portion 161 above the fin 122 and the second portion 162 overlapped with the sidewalls of the fin 122, and the second portion 162 includes the notched feature 163. The notched feature 163 is defined by the following standard. The second portion 162 of the gate 160 has a first width 164 at a boundary of the first portion 161 and the second portion 162, and a second width 165 is at a bottom of the gate 160. The second width 165 is smaller than the first width 164, which proves the gate material is not remained at the bottom of the gate 160.

Further, the second portion 162 also includes a third width 166 between the first width 164 and the second width 165, and the third width 166 is smaller than the first width 164 and the second width 165. The third width 166 is a narrowest width between the first width 164 and the second width 165, which proves the second portion 162 including a notched contour from the first width 164 to the second width 165. The second portion 162 of the gate 160 also includes a first distance 167 from the second width 165 to the third width 166.

Figure 6C:
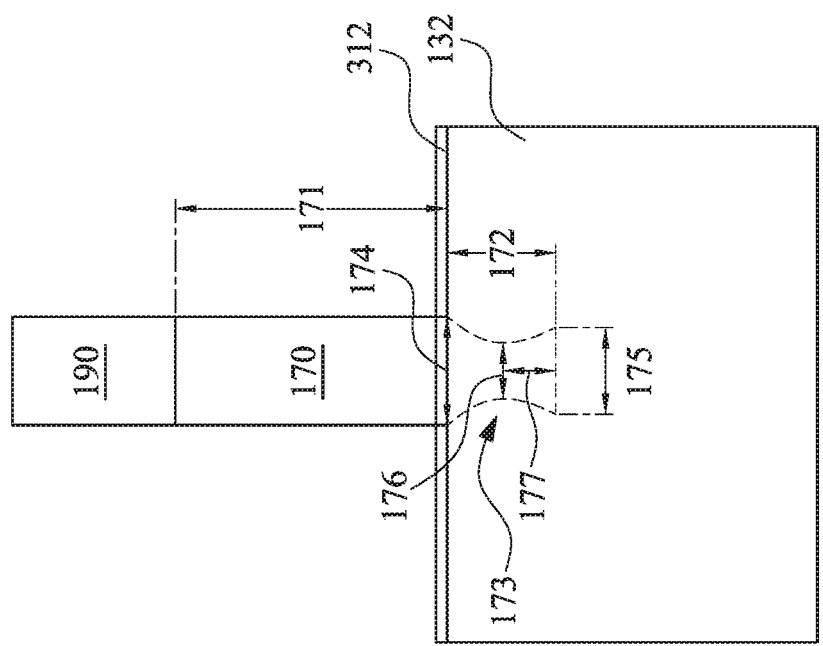

Please refer to FIG. 6C, FIG. 6C is a cross-sectional view of the Fin-FET device in FIG. 1 along the line CC at an intermediate stage of fabrication. As the gate material layer 310 is etched to form the gate 160 at the center region 120, the gate 170 is formed at the periphery region 130 at the same time. The gate 170 at the periphery region 130 includes the first portion 171 above the fin 132 and the second portion 172 overlapped with the sidewalls of the fin 132, and the second portion 172 also includes the notched feature 173. The second portion 172 of the gate 170 has a first width 174 at a boundary of the first portion 171 and the second portion 172, and a second width 175 is at a bottom of the gate 170. The second width 175 is smaller than the first width 174, which proves the gate material is not remained at the bottom of the gate 170. A third width 176 is between the first width 174 and the second width 175, and the third width 176 is smaller than the first width 174 and the second width 175. It could be proved that the gate 170 at the periphery region 130 also includes the notched contour from the first width 174 to the second width 175. Besides, the second portion 172 of the gate 170 also includes a first distance 177 from the second width 175 to the third width 176.

With controlling the ratio of the flow rate of the etching gas at the center region 120 to the flow rate of the etching gas at the periphery region 130, the second portion 162 of the gate 160 at the center region 120 and the second portion 172 of the gate 170 at the periphery region 130 both include the notched feature. The ratio of the flow rate is in a range from 0.33 to 3.

In embodiments, the ratio of the flow rate is in a range from 1 to 1.1, and the gate 160 formed in the center region 120 and the gate 170 formed in the periphery region 130 will include similar notched features. Thus, the first distance 167 of the gate 160 at the center region 120 is closely to the first distance 177 of the gate 170 at the periphery region 130.

In embodiments, the gates 160 and 170 are at a dense area. The first width 164 of the gate 160 and the first width 174 of the gate 170 are in a range from about 16 nm to about 20 nm, and a distance between two adjacent gates is in a range from about 80 nm to about 100 nm.

In embodiments, the gates 160 and 170 are at an iso area. The first width 164 of the gate 160 and the first width 174 of the gate 170 are in a range from about 20 nm to about 240 nm, and a distance between two adjacent gates is in a range from about 300 nm to about 400 nm.

In embodiments, spacers are formed on both sides of the gates 160 and 170. For example, a dielectric material (not shown) may be deposited and then etched to form the spacers on two opposite sides of the gates 160 and 170. The spacers may be made of silicon oxide, silicon nitride, silicon oxynitride, silicon carbon nitride, or other suitable materials. Typical formation methods for the sidewall spacers include depositing a dielectric material over the gate 160 and 170 and the fins 122, 132 and 134, and then anisotropically etching back the dielectric material. The etching back process may include a multiple-step etching to gain etch selectivity, flexibility and desired overetch control.

In embodiments, the gates 160 and 170 will be removed later, and a conductive material may then be deposited to form a metal gate. The metal gate is formed of aluminum, copper, titanium, tantulum, tungsten, molybdenum, tantalum nitride, nickel silicide, cobalt silicide, TiN, WN, TiAl, TiAlN, TaCN, TaC, TaSiN, metal alloys, other suitable materials, or combinations thereof.

Figure 7B:
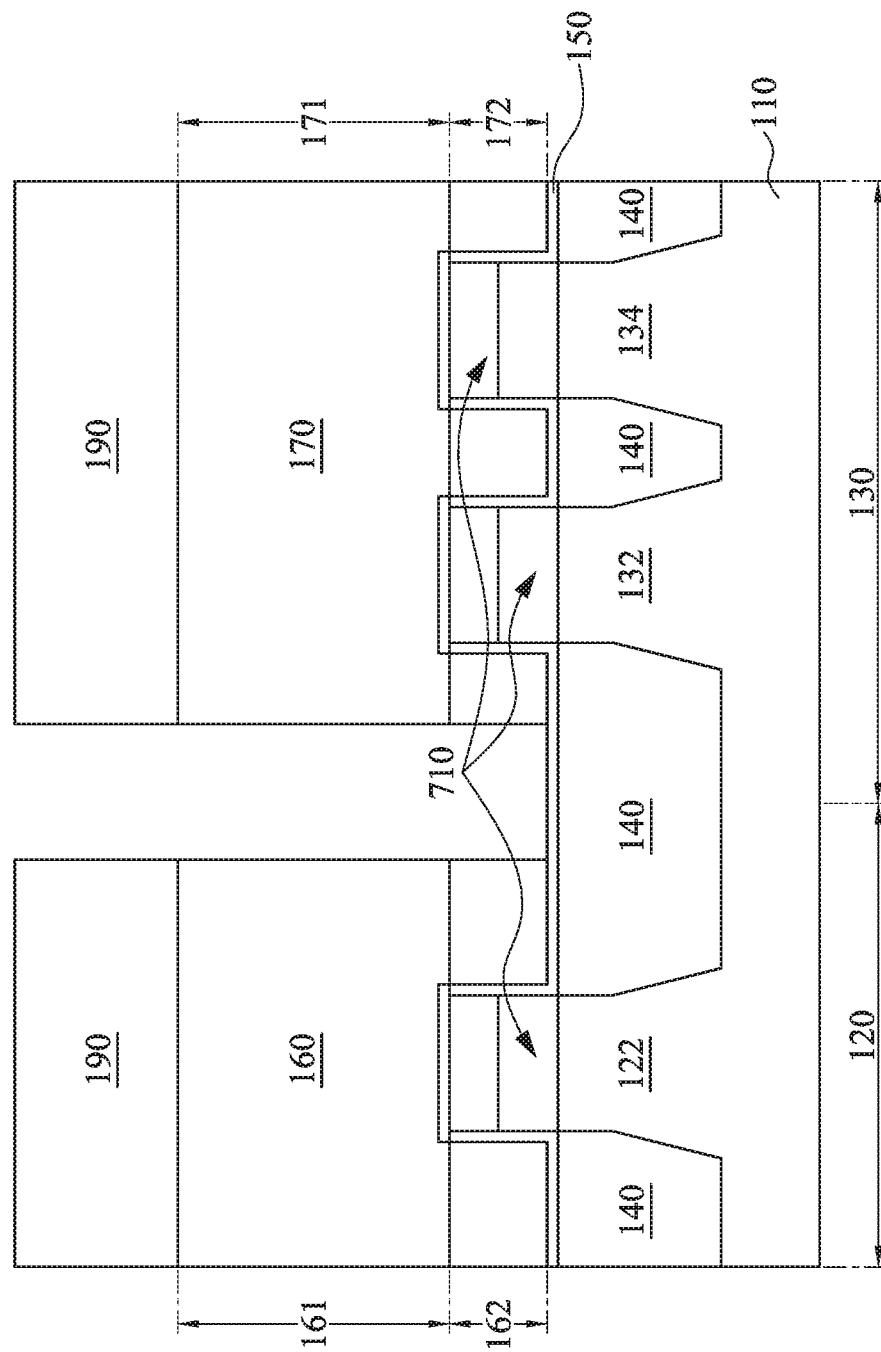

Continuing to operation 250, the fins 122, 132 and 134 are recessed to form holes 710. As shown in FIGS. 7A and 7B, a recessing process etches the fins 122, 132 and 134 to form a plurality of holes 710. Also, the gate oxide layer 312 on the fins 122, 132 and 134 is etched to form the gate oxide 150. The recessing process may include dry etching process, wet etching process, and/or combination thereof. The recessing process may also include a selective wet etch or a selective dry etch. A wet etching solution includes a tetramethylammonium hydroxide (TMAH), a HF/HNO3/CH3COOH solution, or other suitable solution. The dry and wet etching processes have etching parameters which could be tuned, such as etchants used, etching temperature, etching solution concentration, etching pressure, source power, RF bias voltage, RF bias power, etchant flow rate, and other suitable parameters. For example, a wet etching solution may include NH4OH, KOH (potassium hydroxide), HF (hydrofluoric acid), TMAH (tetramethylammonium hydroxide), other suitable wet etching solutions, or combinations thereof. Dry etching processes include a biased plasma etching process that uses a chlorine-based chemistry. Other dry etching gasses include CF4, NF3, SF6, and He. Dry etching may also be performed anisotropically using such mechanisms as DRIE (deep reactive-ion etching).

Referring to operation 260, epitaxial structures 180 are formed in the holes 710. The epitaxial structure 180 is formed by epitaxially growing a semiconductor material including single element semiconductor material such as germanium (Ge) or silicon (Si); or compound semiconductor materials, such as gallium arsenide (GaAs), aluminum gallium arsenide (AlGaAs); or semiconductor alloy, such as silicon germanium (SiGe), gallium arsenide phosphide (GaAsP). In embodiments, the epitaxial structures 180 may be formed by CVD deposition techniques, e.g., vapor-phase epitaxy (VPE) and/or ultra-high vacuum CVD (UHV-CVD), molecular beam epitaxy, and/or other suitable processes.

In embodiments, the epitaxial structures 180 are formed of SiGe.

Figure 8B:
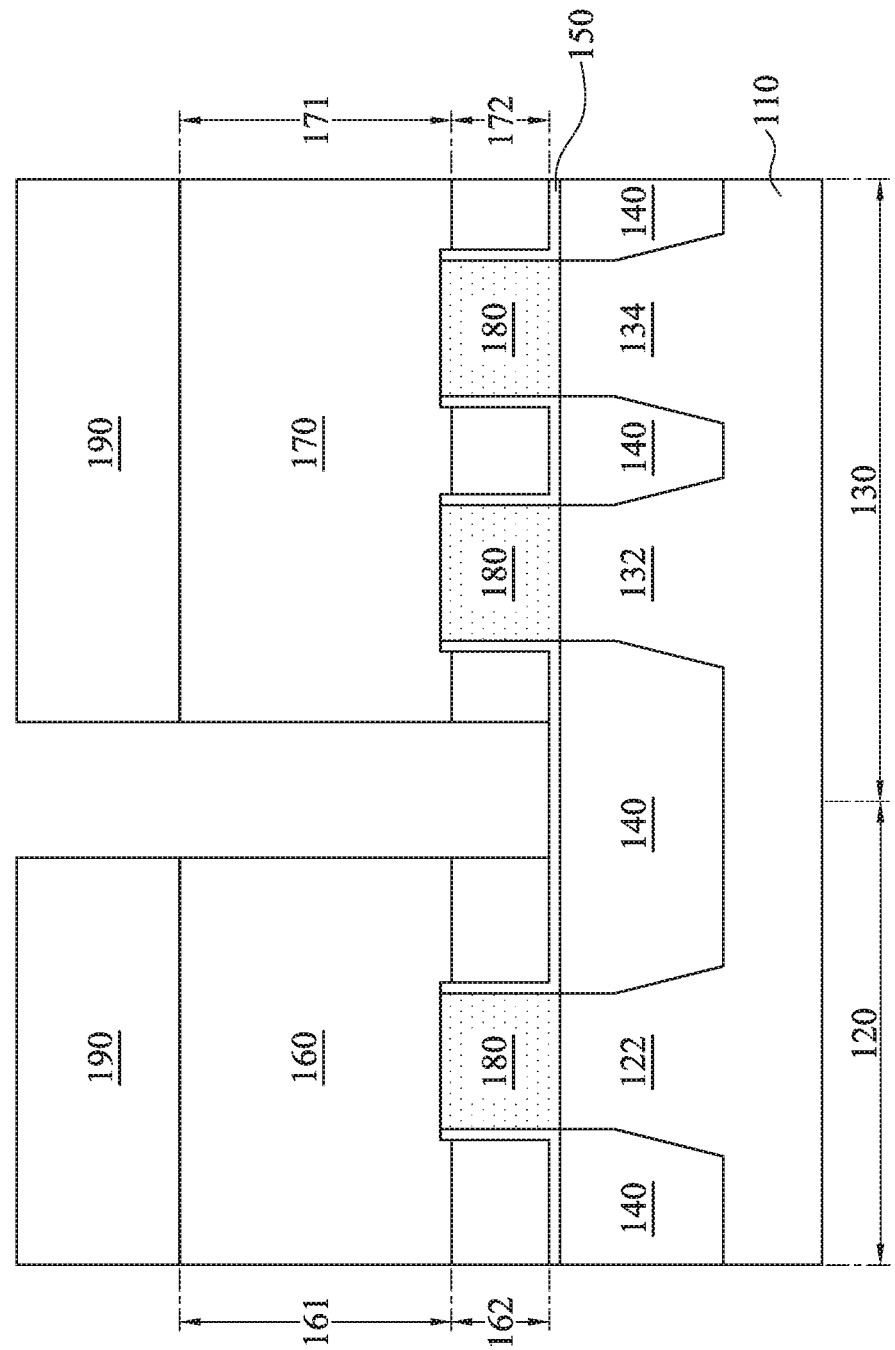

As shown in FIGS. 8A and 8B, the epitaxial structures 180 include a diamond shape having an angle 182. When the angle 182 touching or perforating the gate 160, a failure connection between the epitaxial structure 180 and the gate 160 will make the Fin-FET device 100 crushed. Relatively, the notched feature 163 of the gate 160 enlarges a proximity distance 810 between the gate 160 and the epitaxial structure 180. Thus, the possibility of the failure connection between the gate 160 and the epitaxial structure 180 could be reduced. The proximity distance 810 has a maximum value when the third width 166 and the angle 182 being on a same line. In embodiments, the proximity distance 810 is in a range from about 0.5 nm to about 10 nm.

Please refer to FIG. 8C, FIG. 8C is a cross-sectional view of the Fin-FET device in FIG. 1 along the line CC. Similarly, the gate 170 at the periphery region 130 also includes a proximity distance 820 between the angel 182 and the third width 176. The proximity distance 820 has a maximum value when the third width 176 and the angle 182 being on a same line. In embodiments, the proximity distance 820 is in a range from about 0.5 nm to about 10 nm.

But different epitaxial structures include different shapes, and a position of the angle is also varied with the shape of the epitaxial structure. To ensure the maximum value of the proximity distances, the present disclosure provides a method to control positions of the third widths 166 and 176, which ensures the angle of the epitaxial structure being aligned to the third widths 166 and 176.

The gates 160 and 170 are formed from the etched gate material layer 310 in a predetermined shape by supplying the etching gas at a ratio of a flow rate at the center region 120 to a flow rate at the periphery region 130 in a range from 0.33 to 3, which the predetermined shape is determined by the shape of the epitaxial structures. Further, a first distance from the second width to the third width that is determined by a ratio.

Please referring to FIGS. 9A and 9B, FIG. 9A is a cross-sectional view of the Fin-FET device in FIG. 1 along the line AA, and FIG. 9B is a cross-sectional view of the Fin-FET device in FIG. 1 along the line CC. In FIG. 9B, the position of an angle 932 of the epitaxial structure 930 is much lower at the periphery region 130. The predetermined shape has a first portion 171 disposed above the fin 132 and a second portion 172 overlapped with the sidewalls of the fin 132. The second portion 172 includes a first width 174 at a boundary of the first portion 171 and the second portion 172, and a second width 175 at a bottom of the gate 170. The predetermined shape also has a third width 176 between the first width 174 and the second width 175, which the third width 176 is smaller than the first width 174 and the second width 175. In embodiments, the second width 175 is smaller than the first width 174.

With increasing the flow rate of the etching gas at the periphery region 130, more gate material near the bottom of the gate 170 is etched. Thus, the third width 176 will move downward and being more closely to the second width 175, and the first distance 177 from the second width 175 to the third width 176 is decreased. The third width 176 could move downward to align to the angle 932 of the epitaxial structure 930, and a proximity distance 940 between the gate 170 and the epitaxial structure 930 will have a maximum value.

In FIG. 9A, the position of an angle 912 of the epitaxial structure 910 is much higher at the center region 120. The predetermined shape has a first portion 161 disposed above the fin 122 and a second portion 162 overlapped with the sidewalls of the fin 122. The second portion 162 includes a first width 164 at a boundary of the first portion 161 and the second portion 162, and a second width 165 at a bottom of the gate 160. The predetermined shape also has a third width 166 between the first width 164 and the second width 165, which the third width 166 is smaller than the first width 164 and the second width 165. In embodiments, the second width 165 is smaller than the first width 164.

By decreasing the flow rate of the etching gas at the center region 120, more gate material will remain at the bottom of the gate 160. Thus, the third width 166 will move upward and being more closely to the first width 164, and the first distance 167 from the second width 165 to the third width 166 is increased. The third width 166 moves upward to align to the angle 912 of the epitaxial structure 910, and a proximity distance 920 between the gate 170 and the epitaxial structure 910 will have a maximum value. It should be noticed that the ratio of the flow rate is in a range from 0.3 to 3 to ensure the gate 160 at the center region 120 and the gate 170 at the periphery region 130 still include the notched feature.

In embodiments, the total flow rate is not fixed. The flow rate at the center region 120 and the flow rate at the periphery region 130 is increased or decreased simultaneously to control the position of the third widths 166 and 176. Thus, the first distance 167 from the third width 166 to the second width 165 at the center region 120 and the first distance 177 from the third width 176 to the second width 175 at the periphery region 130 could be increased or decreased simultaneously.

Figure 10:
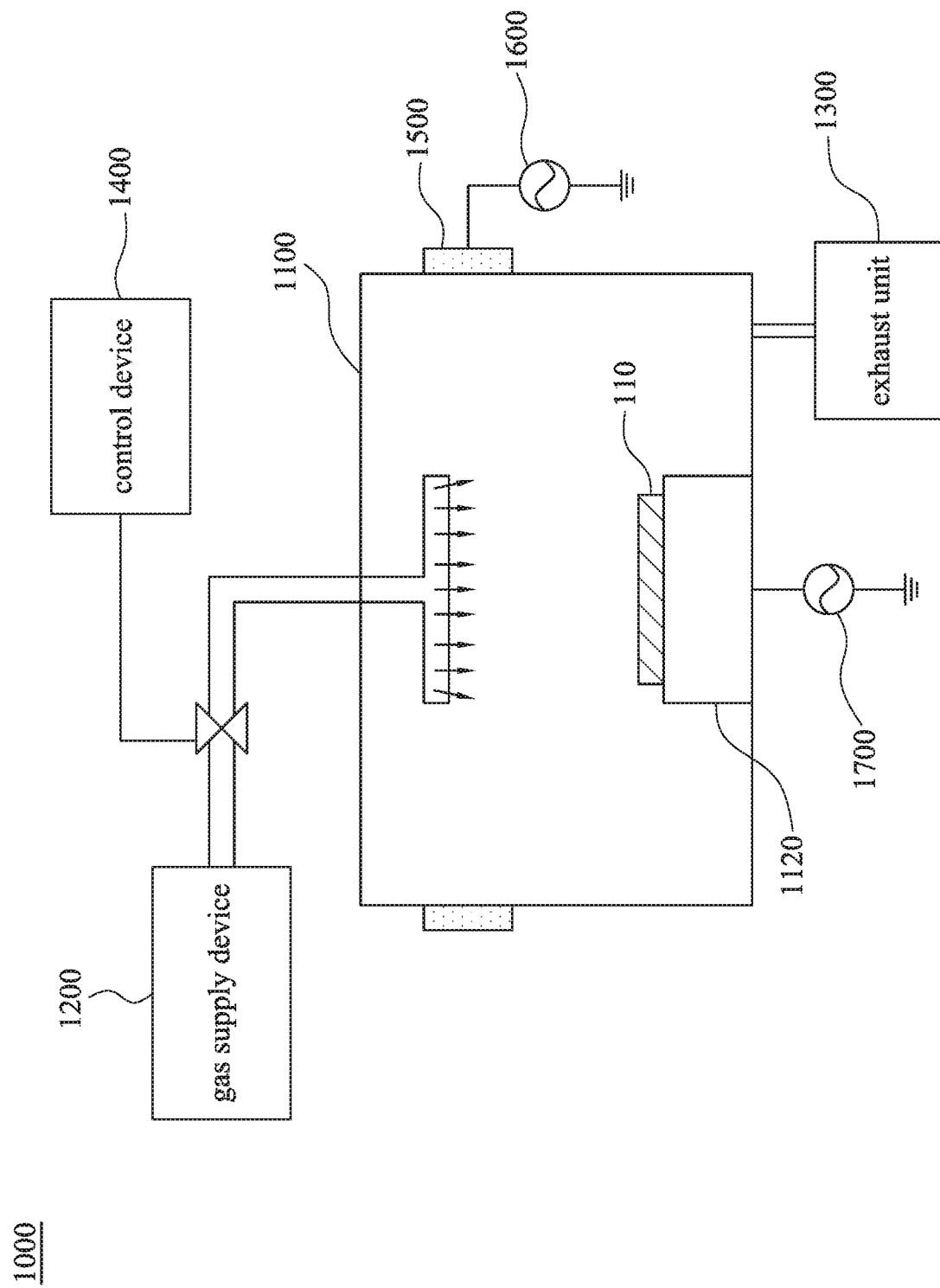
FIG. 10 is a cross-sectional view of a dry etching apparatus, in accordance with various embodiments.

FIG. 10 is a cross-sectional view of a dry etching apparatus 1000 in various embodiment of the present invention. The dry etching apparatus 1000 includes a vacuum chamber 1100 configured to secure a substrate 110 show in FIGS. 5A and 5B. In embodiments, a stage 1120 in the vacuum chamber 110 is configured to secure a substrate 110.

Please refer to FIGS. 5A and 5B at the same time, the substrate 110 includes the center region 120 and the periphery region 130, which the periphery region 130 surrounds the center region 120. A plurality of fins 122, 132 and 134 are formed in the substrate 110, and the gate material layer 310 covers the fins 122, 132 and 134. A gas supply device 1200 supplies the etching gas into the vacuum chamber 1100, and an exhaust unit 1300 expels the etching gas from the vacuum chamber 1100. Thus, the pressure of the vacuum chamber 1100 could be adjusted. In embodiments, the etching gas is hydrogen bromide or oxygen.

The dry etching apparatus 1100 also includes a control device 1400 configured to control the flow rate of the etching gas at the center region 120 and the flow rate of the etching gas at the periphery region 130. The etching gas is supplied at the ratio of the flow rate at the center region 120 to the flow rate at the periphery region 130 in a range from 0.33 to 3. The control device 1400 allocates the etching gas supplied by the gas supply device 1200 to the periphery region 130 and the center region 120 of the substrate 110, and the ratio of the flow rate at the center region 120 to the flow rate at the periphery region 130 is in a range from 0.33 to 3 to ensure the gate formed at the center region 120 and the gate formed at the periphery region 130 both include the notched feature.

Further, an antenna 1500 is at sidewalls of the vacuum chamber 1100. A plasma generating device 1600 is connected to the antenna 1500 for generating a plasma from the etching gas, which the plasma generating device 1600 is a high-frequency power source. The frequency of the high-frequency power source for plasma generation is from 13.56 MHz to 60 MHz. Furthermore, the plasma generating device 1600 for plasma generation may also be driven in a pulsed method.

The plasma generated from the etching gas will etch the gate material layer 310, and the gates are formed at the center region 120 and the periphery region 130. With controlling the etching gas supplied at the ratio of the flow rate at the center region 120 to the flow rate at the periphery region 130, the gate formed at the center region 120 and the gate formed at the periphery region 130 both include the notched feature. The ratio of the flow rate is in a range from 0.33 to 3. In embodiments, the ratio of the flow rate is in a range from 1 to 1.1, and the gate formed in the center region 120 and the gate formed in the periphery region 130 will include similar notched feature.

Also, the dry etching apparatus 1100 includes a radio frequency (RF) bias power supply 1700 of 4 MHz connected to the stage 1120, which is on the purpose to draw ions into the substrate 110 from the plasma to control the ion energy.

The embodiments of the present disclosure discussed above have advantages over existing apparatus and processes, and the advantages are summarized below. With controlling the etching gas supplied at the ratio of the flow rate at the center region to the flow rate at the periphery region in a range from 0.33 to 3, the gate formed at the center region and the gate formed at the periphery region both include the notched feature. The notched feature enlarges the proximity distance between the gate and the epitaxial structure, and thus the gate will not perforated by the epitaxial structure.

Also, the position of the narrowest width is determined by the ratio of the flow rate. The narrowest width could be aligned to the angle of the epitaxial structures with different shapes, and thus ensures the proximity distance having the maximum value. Summarize above points, the gates of the Fin-FET device both include the notched feature, which the notched feature matches the shape of the epitaxial structure to enlarge the proximity distance. Therefore, the performance of the Fin-FET device becomes more stable.

In accordance with various embodiments, a dry etching apparatus includes a process chamber, a stage, a gas supply device and a plasma generating device. The stage is in the process chamber and is configured to support a wafer, wherein the wafer has a center region and a periphery region surrounding the center region. The gas supply device is configured to supply a first flow of an etching gas to the center region and supply a second flow of the etching gas to the periphery region. The plasma generating device is configured to generate plasma from the etching gas.

In accordance with various embodiments, a dry etching apparatus includes a process chamber, a stage, a gas supply device, a control device and a plasma generating device. The stage is in the process chamber and is configured to support a wafer, wherein the wafer has a first region and a second region. The gas supply device is configured to supply a first flow of an etching gas to the first region and supply a second flow of the etching gas to the second region. The control device is configured to control a flow rate of the first flow and a flow rate of the second flow. The plasma generating device is configured to generate plasma from the etching gas.

In accordance with various embodiments, a dry etching apparatus includes a process chamber, a stage, a gas supply device and a control device. The stage is in the process chamber and is configured to support a wafer, wherein the wafer has a center region and a periphery region surrounding the center region. The gas supply device is configured to supply a first flow of an etching gas to the center region and supply a second flow of the etching gas to the periphery region. The control device is configured to control a flow rate of the first flow and a flow rate of the second flow.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An etching apparatus comprising:
   a process chamber;
   a stage in the process chamber and configured to support a wafer, wherein the wafer has a center region and a periphery region surrounding the center region;
   a gas supply device configured to supply a first flow of an etching gas to the center region and simultaneously supply a second flow of the etching gas to the periphery region to etch a gate stack;
   a control device configured to control a flow rate of the first flow and a flow rate of the second flow, wherein the flow rate of the first flow is such that the etched gate stack at the center region has a bottom portion, and the bottom portion of the etched gate stack at the center region has a concave sidewall, and the flow rate of the second flow rate is such that the etched gate stack at the periphery region has a bottom portion, and the bottom portion of the etched gate stack at the periphery region has a concave sidewall; and
   a plasma generating device configured to generate plasma from the etching gas.

2. The etching apparatus of claim 1, further comprising an antenna on a sidewall of the process chamber.

3. The etching apparatus of claim 2, wherein the plasma generating device is connected to the antenna.

4. The etching apparatus of claim 1, further comprising an exhaust unit configured to expel the etching gas from the process chamber.

5. The etching apparatus of claim 1, further comprising a power supply connected to the stage.

6. The etching apparatus of claim 5, wherein the power supply is a radio frequency bias power supply.

7. An etching apparatus comprising:
   a process chamber;
   a stage in the process chamber and configured to support a wafer, wherein the wafer has a first region and a second region;
   a gas supply device configured to supply a first flow of an etching gas to the first region and simultaneously supply a second flow of the etching gas to the second region;
   a control device configured to control the gas supply device, such that a ratio of a flow rate of the first flow to a flow rate of the second flow is in a range from about 0.33 to about 3; and
   a plasma generating device configured to generate plasma from the etching gas.

8. The etching apparatus of claim 7, further comprising an antenna on a sidewall of the process chamber.

9. The etching apparatus of claim 8, wherein the plasma generating device is connected to the antenna.

10. The etching apparatus of claim 8, further comprising an exhaust unit in communication with the process chamber.

11. The etching apparatus of claim 7, further comprising a radio frequency bias power supply connected to the stage.

12. An etching apparatus comprising:
    a process chamber;
    a stage in the process chamber and configured to support a wafer, wherein the wafer has a center region and a periphery region surrounding the center region;
    a gas supply device configured to supply a first flow of an etching gas to the center region and simultaneously supply a second flow of the etching gas to the periphery region to etch a gate stack; and
    a control device configured to control a flow rate of the second flow, such that the etched gate stack at the periphery region has a bottom portion, the bottom portion has a concave sidewall, and a narrowest portion of the bottom portion of the etched gate stack at the periphery region is lower than a narrowest portion of a bottom portion of the etched gate stack at the center region.

13. The etching apparatus of claim 12, further comprising an antenna on a sidewall of the process chamber.

14. The etching apparatus of claim 13, further comprising a power source connected to the antenna.

15. The etching apparatus of claim 12, further comprising an exhaust unit in communication with the process chamber.

16. The etching apparatus of claim 12, further comprising a power supply connected to the stage.

17. The etching apparatus of claim 16, wherein the power supply is a radio frequency bias power supply.

18. The etching apparatus of claim 1, wherein the control device is configured to control the gas supply device, such that a ratio of the flow rate of the first flow to a flow rate of the second flow is in a range from about 1 to about 1.1.

19. The etching apparatus of claim 1, wherein the bottom portion has a narrowest portion at a height such that the narrowest portion of the bottom portion of the etched gate stack at the center region is aligned with an angle of an epitaxial structure after the epitaxial structure is formed.

20. The etching apparatus of claim 1, wherein the bottom portion has a narrowest portion at a height such that a proximity distance between the etched gate stack at the center region and an epitaxial structure is in a range from about 0.5 nm to about 10 nm after the epitaxial structure is formed.

* * * * *